United States Patent [19]
Allen

[11] Patent Number: 4,475,086
[45] Date of Patent: Oct. 2, 1984

[54] DUTY CYCLE DETECTOR

[75] Inventor: James D. Allen, Rochester, N.Y.

[73] Assignee: Eastman Kodak Company, Rochester, N.Y.

[21] Appl. No.: 364,110

[22] Filed: Mar. 31, 1982

[51] Int. Cl.³ .......................... H03K 5/26; H03K 5/05
[52] U.S. Cl. .................................... 328/112; 328/61; 307/234; 307/265; 377/39; 377/45
[58] Field of Search .................. 377/39, 50, 45, 2, 31; 307/265, 234; 328/58, 61

[56] References Cited
U.S. PATENT DOCUMENTS

| | | | |
|---|---|---|---|
| 3,652,832 | 3/1972 | Baumann | 377/45 |
| 3,941,981 | 3/1976 | Abe | 377/2 |
| 3,956,616 | 5/1976 | Knollenberg | 377/45 |
| 3,980,960 | 9/1976 | Hutchinson | 328/112 |
| 4,277,697 | 7/1981 | Hall | 307/265 |
| 4,314,147 | 2/1982 | Miyagawa | 377/31 |
| 4,323,976 | 4/1982 | Radaelli | 377/39 |
| 4,399,412 | 8/1983 | Rinaldi | 307/234 |

Primary Examiner—John S. Heyman
Attorney, Agent, or Firm—William F. Noval

[57] ABSTRACT

Apparatus is disclosed for determining whether the duty cycle of a periodic signal produced by an incremental encoder is within a predetermined acceptable range. The apparatus includes an oscillator which produces clock pulses at a substantially higher frequency than the periodic signal and a counter which is effective during a selected period of the periodic signal to add the number of clock pulses produced during that portion of the period when the square wave signal is high and subtract from the accumulated number, the number of clock pulses produced when the signal is low. A detector, in response to the final number held by the counter, determines whether the duty cycle is within the predetermined acceptable range.

7 Claims, 2 Drawing Figures

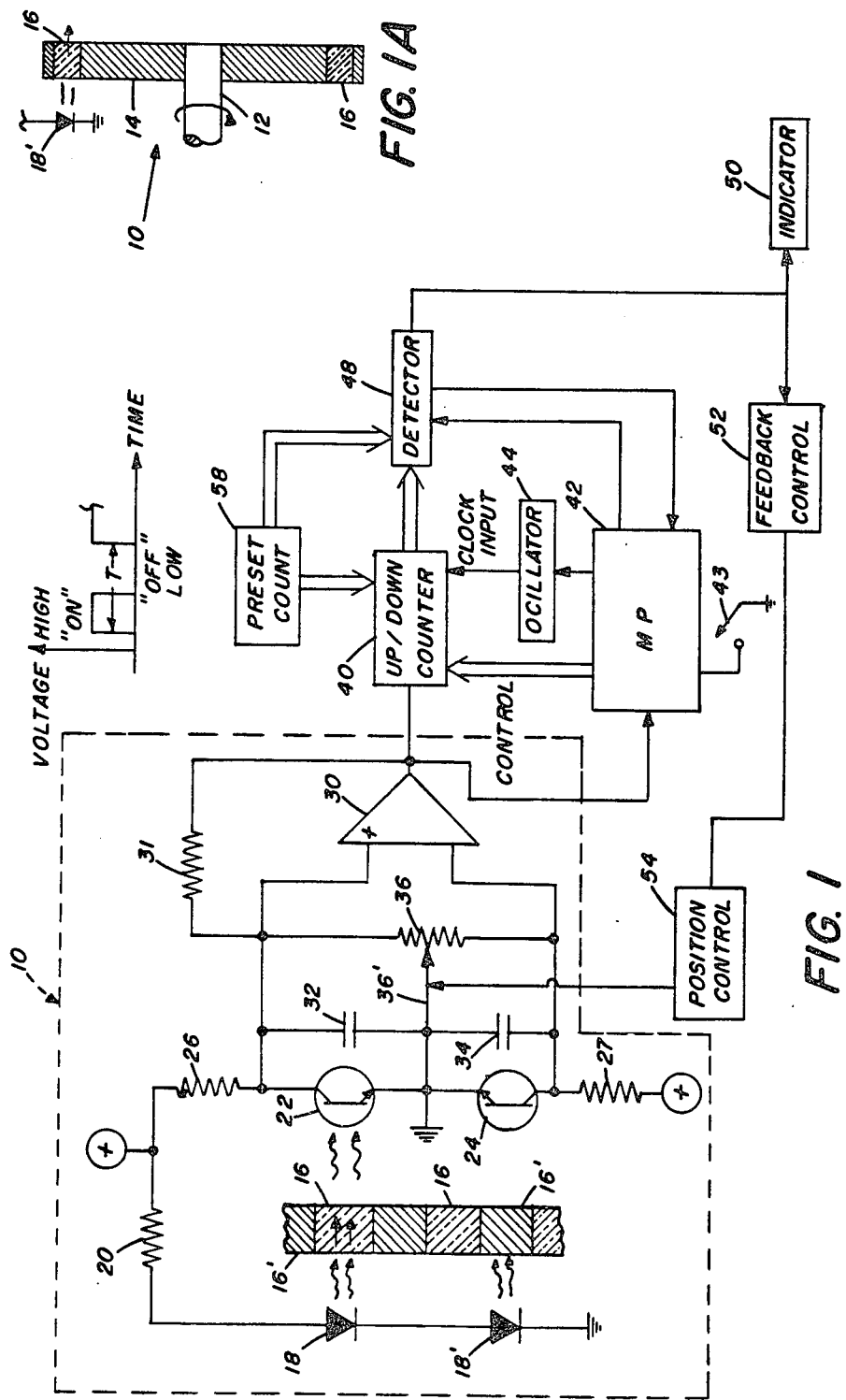

ured which has been found to be suitable for use in the present invention is model VOE-023 manufactured by Vernitron Corpo-

DUTY CYCLE DETECTOR

BACKGROUND OF THE INVENTION

This invention relates to apparatus which determines whether the duty cycle of a periodic signal produced by an incremental encoder is within a predetermined acceptable range.

Incremental encoders are used to provide sinusoidal timing signals in response to angular displacement usually of a shaft or drum. Often, these signals are converted to square waves, since square waves are compatible with conventional high-speed digital control electronic logic such as TTL, HTL, and MOS. For either a periodic sinusoidal or periodic square wave signal, we will define the term "duty cycle" in relation to a specified period of such signal as that duration of the period when timing information is provided divided by the total duration of the period expressed as a percent. Noise can be caused by mechanical vibrations or by electrical interference. If the periodic signal is subjected to noise, and the timing information is no longer accurate, the duty cycle will be outside of an acceptable range. It is, of course, desirable to detect when a duty cycle is no longer within an acceptable range and to make an adjustment to return it to within such acceptable range so that the timing information is accurate.

SUMMARY OF THE INVENTION

In accordance with the invention, a duty cycle detector apparatus determines whether the duty cycle of a periodic signal produced by an incremental encoder is within a predetermined acceptable duty cycle range expressed as a percent (e.g., 45-55%). An oscillator produces clock pulses at a substantially higher frequency than the periodic signal. During a selected period of the signal, a counter adds the number of clock pulses produced when the signal provides timing information and subtracts from its accumulated number the number of clock pulses produced when the signal does not provide timing information. At the end of the period, the counter holds a final number. A detector compares this number with predetermined numerical limits which correspond to the predetermined acceptable duty cycle range. If the number is within these numerical limits, the duty cycle is within the acceptable range and if the number is outside these limits, the duty cycle is outside these limits.

BRIEF DESCRIPTION OF THE DRAWINGS

FIG. 1 is a schematic showing a duty cycle detector apparatus in accordance with the present invention; and FIG. 1A is a schematic of a portion of the incremental encoder depicted in FIG. 1.

DESCRIPTION OF THE PREFERRED EMBODIMENT

Because incremental shaft encoders are generally well known, the present description will be directed particularly to encoder elements forming part of, or cooperating more directly with, apparatus in accordance with the invention; shaft encoder elements not specifically shown or described herein will be understood to be selectable from those known in the art. Optical incremental shaft encoders are well known in the art. An example of a partial encoder 10 which has been found to be suitable for use in the present invention is model VOE-023 manufactured by Vernitron Corporation located at 300 Marcus Blvd., Dear Park, N.Y., N.Y., 11729.

Turning to FIG. 1A, there is a schematic showing of a portion of a conventinal incremental shaft encoder 10. The encoder 10 includes a shaft 12, and a code disc 14 fixed to the shaft. Near the periphery of the disc 14, there are a series of alternating transparent 16 and opaque windows 16'. At two spaced fixed positions (see FIG. 1), the windows move by two light-emitting diodes (LED's) 18 and 18'. Only LED 18' is shown in FIG. 1A. The LED's 18 and 18' are positioned so that at one point in time, light from one passes through a transparent window 16 while at the same time, light from the other is blocked by a separate opaque window 16'. The two light-emitting diodes 18' are connected in series to a source of positive potential through a resistor 20. They are continuously on. When light from these diodes passes through transparent windows, the base of phototransistors 22 and 24 are illuminated. When illuminated, the transistors become more conductive.

The incremental shaft encoder disclosed in this embodiment produces a periodic square wave output. It includes circuitry including the phototransistors 22 and 24, which are connected in parallel and produce a differential signal. This differential signal is provided as an input to an operational amplifier 30 with a feedback resistor 31. The operational amplifier 30 produces the periodic square wave signal. As shown, phototransistor 22 receives light from LED 18 while light from LED 18' is blocked from phototransistor 24 by the code disc 14. These phototransistors are connected to the source of positive potential through resistors 26 and 27. The emitter electrodes are tied together and connected to ground. Capacitors 32 and 34 are respectively connected across the collector emitter junction of phototransistors 22 and 24 and are provided for smoothing and noise reduction of the differential signal.

An adjustable potentiometer 36 is connected across the non-inverting and inverting inputs of the operational amplifier 30 and the collectors of phototransistors 22 and 24. By adjusting the position of a wiper 36', the duty cycle of the square wave can be changed.

In FIG. 1, the waveform at the output of the operational amplifier shows only one period of the periodic square wave. In this embodiment, when the square wave is high ("on"), we will consider timing information to be provided. Conversely, when the signal is low ("off"), no timing information will be provided. In this embodiment, the duty cycle is the time the square wave is high or "on", divided by the total time "T" of the period. Changing the position of the wiper 36' causes either an increase or decrease of the duty cycle.

The periodic square wave of the encoder 10 is applied as an input to an up/down counter 40 and a microprocessor 42. When an operator or serviceperson desires to measure the duty cycle, he depresses a switch 43. After switch 43 is closed, the microprocessor 43, upon receipt of the leading rising edge of the high portion of a square wave signal, provides control signals to the counter 40 and a stable oscillator 44. The oscillator 44 provides clock pulses which are at a much higher frequency than the square wave. Clock pulses from the oscillator 44 also can be used to drive the microprocessor 42. The counter 40 increments, i.e. adds "1", each time a clock pulse is produced during that portion of a period when the square wave signal is high. The trailing edge of the high portion of the square wave signal and the low portion of the signal causes the counter to operate in a countdown mode so that during the low portion of a period, the counter decrements, i.e. subtracts "1", from its accumulated number, each time a clock pulse is produced when the square wave signal is low. Upon receipt of the next rising edge of the square wave, the counter is placed in a hold mode so that it can perform no further counting operations until the final number held by it is operated upon. At this time, the microprocessor 42 provides an input to a detector 48. The detector is a conventional, programmable, digital comparator which is preset with numerical limits, which as will be explained shortly correspond to an acceptable duty cycle range. The detector then determines if the final number is within these limits. If it is, then the duty cycle is operating within the acceptable range; if not, it provides a signal to an indicator 50 which tells an operator or serviceperson that an adjustment must be made in the duty cycle. To make that adjustment, an operator adjusts the position of the wiper 36'. To determine if the adjustment has placed the duty cycle within the acceptable range, the operator or serviceperson again depresses switch 43, and the above operation is repeated.

A specific example which is intended only to illustrate the operation of the duty cycle detector apparatus 48 is now set forth. Let us assume that we desire a 50% nominal value duty cycle and further let us assume that during period of the square wave, 200 clock pulses will be produced. If the duty cycle were perfectly at a 50% duty cycle, 100 clock pulses would be provided when the square wave is high and 100 when it is low. In this example, we will use a decimal notation, but it will be understood that the counter 40 and detector 48 will provide all of the actual operations using a binary notation. Let us assume further that the duty cycle with a nominal value of 50%, and a tolerance of ±5% would still be acceptable. In other words, any duty cycle in a duty cycle range of 50%, ±5%, or 45-55% would be acceptable. With a total of 200 clock pulses produced during the period, there can be 90-110 clock pulses produced when the signal is high and the duty cycle will not have to be adjusted. Viewed differently, the final number "n" held by the counter can be any number from −10 to +10 and the measured duty cycle will be acceptable. In order to detect this duty cycle range, the detector 48 is preset with the numerical limits $-10 \leq n \leq +10$, which correspond to the ±5% tolerance, where n is the final number held by the counter 40. If the detector determines that the final number "n" held by the counter is within these limits, then it would provide an indication that the duty cycle is within the acceptable range. However, if for example the counter holds the number −11, it would then provide a signal to the indicator 50 telling him that the duty cycle was too low. The operator then manually adjusts wiper 36' increasing the duty cycle.

Shown in FIG. 1, however, is an arrangement whereby this adjustment is made automatically. The detector 48 provides an input to a feedback control circuit 52. The circuit 52 translates the number held by the up/down counter 40 to a position control signal which is applied to position control mechanism 54. In response to the control signal, mechanism 54 adjusts the location of the wiper 36'. The microprocessor repeats the above operation until the detector 48 indicates that the duty cycle is in the acceptable range.

Coupled to the counter is a preset count mechanism 58. In the example previously described, we assumed that the number laid by the counter 40 at the start of a period was "0". The mechanism 58 provides a simple yet effective means to change the nominal value of the duty cycle. If in the above example with 200 clock pulses provided during a period, the nominal value of duty cycle is to be 55% and the acceptable duty cycle range is 55%±5% then, an operator or serviceperson would cause the mechanism 58, which includes a keyboard, to enter the number −10 into the counter 40. For another example, if the duty cycle range were to be 45±5%, then the number +10 would be entered into the counter 40. If at the end of a period the detector 48 determines that the number held by the counter is within the numerical limits $-10 \leq n \leq 10$, the duty cycle will be within the new acceptable range. The mechanism 58 is also adapted to be able to change the numerical limits held by detector 48. For example, if the duty cycle was to be within the range of 55%+2.5%, an operator would preset the counter with the number −10 and change the numerical limits in the programmable detector 48 to be $-5 \leq n \leq 5$.

The invention has been described in detail with particular reference to a preferred embodiment thereof, but it will be understood that variations and modifications can be effected within the spirit and scope of the invention.

I claim:

1. For use with an incremental encoder which produces a periodic signal of a first frequency having, during each period, high and low portions, apparatus for determining whether the duty cycle of such periodic signal of said first frequency is within a predetermined acceptable range, comprising:
    (a) stable oscillator means for producing clock pulses at a second frequency of a substantially higher frequency than the first frequency of said periodic signal;
    (b) counter means for adding and subtracting clock pulses of said second frequency produced by said oscillator means;
    (c) logic and control means coupled to said oscillator means and said counter means and responsive during a selected period of said periodic signal of said first frequency for causing said counter means to add the number of pulses of said second frequency produced by said oscillator means during one of said portions of the selected period and to subtract from the accumulated number, the number of pulses produced by said oscillator means during the other of said portion of the selected period, whereby at the end of the selected period said counter means holds a final number; and
    (d) detector means for comparing such final number with predetermined numerical limits which correspond to the predetermined acceptable range to determine if the duty cycle of said periodic signal of said first frequency is within such range.

2. The invention as set forth in claim 1 wherein said counter means is programmable and including preset count means for entering a selected number at the beginning of said selected period into said programmable counter means to change the nominal value of the duty cycle range.

3. The invention as set forth in claim 2, wherein said detector means is programmable and wherein said preset count means is adapted to change the limits in said programmable detector means.

4. The invention as set forth to claim 1 wherein after the end of said selected period of said periodic signal said logic and control means places said counter means in a hold mode so that it can perform no further counting operations until said final number is operated on by said detector means.

5. For use with an incremental encoder which produces a periodic signal of a first frequency having, during each period, high and low portions, said encoder including means for changing the duty cycle of such signal, duty cycle adjusting apparatus for maintaining the duty cycle of such periodic signal of said first frequency within a predetermined acceptable range comprising:
   (a) stable oscillator means for producing clock pulses at a second frequency of a substantially higher frequency than the first frequency of said periodic signal;
   (b) counter means for adding and subtracting clock pulses of said second frequency produced by said oscillator means;
   (c) logic and control means coupled to said oscillator means and said counter means and responsive during a selected period of said periodic signal of said first frequency for causing said counter means to add the number of pulses of said second frequency produced by said oscillator means during one of said portions of the selected period and to subtract from the accumulated number, the number of pulses produced by said oscillator means during the other of said portions of the selected period, whereby at the end of the selected period said counter means holds a final number;
   (d) means for comparing such final number with numerical limits which correspond to said predetermined acceptable range and for producing a position control signal if the number is outside such limits indicating the duty cycle of said periodic signal of said first frequency is outside such acceptable range; and
   (e) means responsive to said position control signal for adjusting said duty cycle changing means to return the duty cycle of said periodic signal to be within the acceptable range.

6. The invention as set forth in claim 5 wherein said counter means is programmable and including preset count means for entering a selected number at the beginning of said selected period into said counter means to change the nominal value of the duty cycle range.

7. The invention as set forth in claim 6, wherein said comparing means is programmable and wherein said preset count means is adapted to change the limits in said comparing means.

* * * * *